(12) United States Patent
Matsuura et al.

(10) Patent No.: US 7,183,867 B2
(45) Date of Patent: Feb. 27, 2007

(54) VOLTAGE CONTROLLED VARIABLE CAPACITOR

(75) Inventors: Junichi Matsuura, Tokyo (JP); Eiichi Kaminishi, Osaka (JP); Noriyuki Fujita, Saitama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 109 days.

(21) Appl. No.: 10/964,704

(22) Filed: Oct. 15, 2004

(65) Prior Publication Data

US 2005/0083105 A1 Apr. 21, 2005

(30) Foreign Application Priority Data

Oct. 17, 2003 (JP) .............................. 2003-357505

(51) Int. Cl.
*H03L 7/00* (2006.01)
(52) U.S. Cl. .............................. 331/117 FE; 331/36 C; 331/177 V; 331/167
(58) Field of Classification Search ................ 331/176, 331/158, 177 V, 116 FE, 36 C, 167, 117 FE
See application file for complete search history.

(56) References Cited

U.S. PATENT DOCUMENTS 5,117,206 A * 5/1992 Imamura ..................... 331/158
6,308,055 B1 * 10/2001 Welland et al. ............. 455/260

FOREIGN PATENT DOCUMENTS

| DE | 26 38 055 | 3/1977 |
|---|---|---|
| JP | 64-61070 A | 3/1989 |
| JP | 3-175804 A | 7/1991 |
| JP | 7-193477 A | 7/1995 |
| JP | 9-307356 A | 11/1997 |
| JP | 10-51238 | 2/1998 |
| JP | 2000-278093 A | 10/2000 |
| JP | 3222366 | 8/2001 |
| JP | 2003-273725 A | 9/2003 |
| JP | 2003-282723 A | 10/2003 |

* cited by examiner

*Primary Examiner*—Arnold Kinkead
(74) *Attorney, Agent, or Firm*—McDermott Will & Emery LLP

(57) ABSTRACT

To provide a voltage controlled variable capacitor which can change a capacitance value thereof in a wide controlled voltage range and control the capacitance value easily with a high precision without complicating the circuit configuration thereof, and to provide a voltage controlled variable capacitor which can change a capacitance value thereof with a good linearity. The voltage controlled varactor is configured in a manner that varactors VCk, each formed by a series connection of a fixed capacitor Ck (k=1, 2, . . . , n) and a MOS transistor Mk of N channel type, are connected in parallel. The MOS transistors M1 to Mn are configured in a manner that gate widths W are same but gate lengths L1 to Ln are elongated sequentially (that is, L1<L2< . . . <Ln) so that the threshold voltages thereof are differentiated from one another.

19 Claims, 9 Drawing Sheets

$L1 < L2 < L3 < \cdots < Ln$
$Vt1 < Vt2 < Vt3 < \cdots < Vtn$ $L1 < L2 < L3 < \cdots < Ln$
$Vt1 < Vt2 < Vt3 < \cdots < Vtn$ $W1 > W2 > W3 > \cdots > Wn$
$Vt1 < Vt2 < Vt3 < \cdots < Vtn$ $W1 > W2 > W3 > \cdots > Wn$
$Vt1 < Vt2 < Vt3 < \cdots < Vtn$ $W1/L1 > W2/L2 > W3/L3 > \cdots > Wn/Ln$
$Vt1 < Vt2 < Vt3 < \cdots < Vtn$ $W1/L1 > W2/L2 > W3/L3 > \cdots > Wn/Ln$
$Vt1 < Vt2 < Vt3 < \cdots < Vtn$ VFB1 > VFB2 > VFB3 > ···· > VFBn
Vt1 < Vt2 < Vt3 < ···· < Vtn VFB1 > VFB2 > VFB3 > ···· > VFBn
Vt1 < Vt2 < Vt3 < ···· < Vtn $Vcont1 > Vcont2 > Vcont3 > \cdots > Vcontn$

VOLTAGE CONTROLLED VARIABLE CAPACITOR

BACKGROUND OF THE INVENTION

1. Field of the Invention

The present invention relates to a voltage controlled variable capacitor which capacitance value is changed in accordance with a control voltage applied thereto.

2. Description of the Related Art

In signal processing circuits used in communication terminals etc., oscillators oscillating with high precision are desired in order to generate clock signals accurately. Conventionally, in order to improve the oscillation accuracy of a crystal oscillator used in general, there is known a VCXO (voltage controlled crystal oscillator) that includes a voltage controlled variable capacitor (a voltage controlled varactor) which capacitance value changes in accordance with a control voltage and a crystal vibrator which oscillates at a frequency according to the capacitance value of the voltage controlled varactor. There is also known a TCXO (a temperature compensated crystal oscillator or a crystal oscillator with a temperature compensation circuit) in which, in order to compensate the frequency variation of a crystal vibrator depending on a temperature, a control voltage which is compensated in temperature characteristics by a temperature compensation circuit is applied to a voltage controlled varactor thereby to oscillate the crystal vibrator at a desired frequency.

As a conventional voltage controlled varactor used in the aforesaid oscillator, there is one shown in FIGS. 12 to 14.

FIG. 12 shows a voltage controlled varactor using a diode. The voltage controlled varactor is arranged in a manner that the anode side of a PN junction diode is grounded and a terminal Zc on the cathode side thereof is applied with a control voltage, whereby the width of a depletion layer formed at the pn junction surface of the diode is changed thereby to change a capacitance value seen from the terminal Zc. The voltage controlled varactor shown in the figure configured to apply a reverse bias to the diode can change the capacitance value thereof by changing the control voltage in a certain range. However, in general, such the voltage controlled varactor can not make so high the sensitivity of the change of the capacitance value with respect to the change of the control voltage.

FIG. 13 is a voltage controlled varactor using a fixed capacitor and a MOS transistor. The voltage controlled varactor is arranged in a manner that the one end of the fixed capacitor and the drain of the MOS transistor are connected in series and the source of the MOS transistor is grounded, whereby the gate voltage of the MOS transistor is changed to thereby change the on-resistance value of the MOS transistor to change a capacitance value seen from the other end Zc of the capacitor (see Japanese Patent No. 3222366, for example).

FIG. 15(A) is a diagram showing characteristics (C-V characteristics) of the change of a capacitance value seen from the terminal Zc with respect to the control voltage Vcont of the voltage controlled varactor shown in FIG. 13. When the control voltage Vcont applied to the gate is gradually increased from the ground voltage and exceeds a threshold value Vt, the MOS transistor starts to turn on. That is, the on-resistance value of the MOS transistor decreases as the control voltage Vcont increases. Thus, the capacitance value of the voltage controlled varactor rapidly changes from 0 farad (F) to C (F) within a controlled voltage range ΔVC as shown in FIG. 15(A). As shown in this figure, this C-V characteristics is not good in linearity.

FIG. 15(B) is a diagram showing the changing rate (C-V sensitivity) of the capacitance value of the voltage controlled varactor with respect to the control voltage Vcont. As shown in this figure, the C-V sensitivity has no range representing almost the same value within the controlled voltage range VC. In other word, it will be understood that the changing characteristics of the capacitance value of the voltage controlled varactor is not linear.

FIG. 15(C) is a diagram showing the characteristics (f-V characteristics) of the oscillation frequency with respect to the control voltage Vcont in the case of using the voltage controlled varactor in a voltage controlled crystal oscillator. As shown in this figure, when the control voltage Vcont is changed in the voltage range ΔVC by using the voltage controlled varactor, the capacitance value of the voltage controlled varactor changes rapidly and further the changing characteristics is not linear. Thus, the oscillation frequency of the voltage controlled crystal oscillator can not be changed linearly.

That is, according to the voltage controlled varactor thus configured, although the sensitivity of the change of the capacitance value with respect to the change of the control voltage is high, the control voltage can be changed only in a small voltage range. Further, the linearity of the change of the capacitance value with respect to the change of the control voltage is not good. Thus, the voltage controlled varactor has difficulty in its control and hence has difficulty in using for compensating the frequency of the crystal oscillator.

FIG. 14 is a voltage controlled varactor in which the aforesaid conventional technique has been improved. This voltage controlled varactor is arranged in a manner that a plurality of the varactors each shown in FIG. 13 are connected in parallel, and control voltages Vcont1 to Vcontn having different values (Vcont1>Vcont2> - - - >Vcontn) are applied to the gates of MOS transistos (M1 to Mn) constituting the varactors, respectively, thereby to change the capacitance value seen from the terminal Zc. The respective control voltages are generated so as to have a predetermined deviation value therebetween in a manner that Vcont1=Vc, Vcont2=Vc−Voff1, Vcont3=Vc−Voff2 - - - . These control voltages are applied to the MOS transistors, respectively. Thus, when the voltage Vc is raised from the GND voltage and when Vcont1 (=Vc) reaches a threshold voltage VT at which the MOS transistor starts to turn on, the capacitance value of a varactor VC1 including the MOS transistor M1 starts to change. When the voltage Vc is further raised and reaches VT+Voff1 (that is, Vcont2=Vt), the capacitance value of a varactor VC2 including the MOS transistor M2 starts to change. In this respect, the value of Voff1 is determined in a manner that when the changing value of the capacitance value of the varactor VC1 becomes smaller after the capacitance value thereof starts to change, the capacitance value of the varactor VC2 starts to change. In the similar manner, the values of Voff2, Voff3 - - - are determined.

According to such a voltage controlled varactor, the control voltages having the different values are applied to the varactors, respectively. When the voltage Vc is increased, at first, the capacitance value of the varactor VC1 starts to change, and when the control voltage increases by the predetermined value (Voff1), the capacitance value of the varactor VC2 starts to change. Thus, the capacitance value (the entire capacitance value of the voltage controlled varactor) seen from the terminal Zc can be changed in a wide controlled voltage range. Further, according to this voltage controlled varactor, as described above, since the control voltages (Vcont1 to Vcontn) are applied in the predetermined pattern to the respective MOS transistors, the capacitance value seen from the terminal Zc can be changed linearly (see JP-A-10-51238, for example).

However, according to the aforesaid conventional voltage controlled varactor in which a plural sets of the fixed capacitor and the MOS transistor are connected in parallel, since the control voltages respectively having different values are applied to the MOS transistors, respectively, a plurality of circuits each for generating the control voltage are required. Thus, the circuit configuration becomes complicated and it is difficult to control the capacitance value with a high precision. Further, since the circuit configuration becomes complicated, it is difficult to reduce the circuit scale thereby to reduce a chip area.

SUMMARY OF THE INVENTION

The present invention was made in view of the aforesaid circumstances and an object of the invention is to provide a voltage controlled variable capacitor which can change a capacitance value thereof in a wide controlled voltage range and control the capacitance value easily with a high precision without complicating the circuit configuration thereof. Further, an object of the invention is to provide a voltage controlled variable capacitor which can change a capacitance value thereof with a good linearity.

The voltage controlled variable capacitor according to the invention is a voltage controlled variable capacitor which capacitance value changes in accordance with a control voltage applied thereto. The voltage controlled variable capacitor includes a plurality of variable capacitance means each of which is constituted to have a fixed capacitor and a MOS transistor, wherein threshold voltages of the MOS transistors, at which the MOS transistors start to turn on in response to a gate voltage applied thereto, differ among the plurality of variable capacitance means; the plurality of variable capacitance means exhibit capacitance values based on the different threshold voltages with respect to a predetermined control voltage, respectively; and a capacitance value of the voltage controlled variable capacitor is a composite value of the capacitance values of the plurality of variable capacitance means.

According to such a configuration, since the threshold values differ among the plurality of variable capacitance means and a controlled voltage range with respect to the variable capacitance means differ among the plurality of variable capacitance means, the capacitance value of the voltage controlled variable capacitor can be changed in a wide controlled voltage range. Further, since the same control voltage is applied to plurality of variable capacitance means, the capacitance value can be controlled easily with good precision without complicating the circuit configuration.

The variable capacitance means of the voltage controlled variable capacitor according to the invention is constituted by connecting the fixed capacitor and the source-drain of the MOS transistor, and the plurality of variable capacitance means are connected in parallel. According to such a configuration, the capacitance value of the voltage controlled variable capacitor an be changed in a side controlled voltage range and the capacitance value can be controlled easily with good precision without complicating the circuit configuration.

The MOS transistors of the plurality of variable capacitance means of the voltage controlled variable capacitor according to the invention start to turn on at different values of the control voltage applied thereto in accordance with increase of the control voltage, respectively. According to such a configuration, the plurality of variable capacitance means start to turn on sequentially one by one in accordance with the increase of the control voltage, so that the capacitance value can be controlled with good linearity with respect to the change of the control voltage.

The MOS transistors of the plurality of variable capacitance means of the voltage controlled variable capacitor according to the invention start to turn on sequentially one by one in accordance with increase of the control voltage, and the MOS transistor of next one of the plurality of variable capacitance means starts to turn on when a changing rate of a capacitance value of another of the plurality of variable capacitance means including the MOS transistor having been turned on previously starts to reduces. According to such a configuration, when the control voltage is increased, the changing rate of the capacitance value which is the composition of the capacitance values of the plurality of variable capacitance means can be made constant. Thus, the capacitance value can be controlled with good linearity with respect to the increase of the control voltage.

The MOS transistors of the voltage controlled variable capacitor according to the invention have the same gate width and have different gate lengths from one another among the plurality of variable capacitance means. According to such a configuration, the MOS transistors can have different threshold voltages in accordance with the gate lengths thereof among the plurality of variable capacitance means, respectively.

The MOS transistors of the voltage controlled variable capacitor according to the invention have the same gate length and have different gate widths from one another among the plurality of variable capacitance means. According to such a configuration, the MOS transistors can have different threshold voltages in accordance with the gate widths thereof among the plurality of variable capacitance means, respectively.

The MOS transistors of the voltage controlled variable capacitor according to the invention is arranged in a manner that a ratio between a gate width and a gate length of the MOS transistor is differentiated from one another among the plurality of variable capacitance means. According to such a configuration, the MOS transistors can have different threshold voltages in accordance with the ratios between the gate widths and the gate lengths thereof among the plurality of variable capacitance means, respectively.

The MOS transistors of the voltage controlled variable capacitor according to the invention is arranged in a manner that the back gate voltages of the MOS transistors are differentiated among the plurality of variable capacitance means, respectively. According to such a configuration, the MOS transistors can have different threshold voltages in accordance with the back gate voltages thereof among the plurality of variable capacitance means, respectively.

The semiconductor integrated circuit according to the invention includes the voltage controlled variable capacitor according to the invention.

The VCXO module according to the invention includes a voltage controlled variable capacitor according to the invention, an oscillation circuit and a crystal resonator. According to such a configuration, a desired frequency signal can be oscillated easily with good precision in a wide controlled voltage range. Further, since the circuit configuration is not complicated, the circuit size can be reduced and so the chip area can also be reduced.

The TCXO module according to the invention includes the voltage controlled variable capacitor according to the invention, an oscillation circuit, a temperature compensation circuit and a crystal resonator. According to such a configuration, a desired frequency signal subjected to the temperature compensation can be oscillated easily with good precision in a wide controlled voltage range. Further, since the circuit configuration is not complicated, the circuit size can be reduced and so the chip area can also be reduced.

The communication terminal according to the invention includes a crystal oscillation module constituted by using the voltage controlled variable capacitor according to the invention. According to such a configuration, a frequency signal with a high precision is oscillated and so the stability is improved Further, since the circuit configuration is not complicated, the terminal can be miniaturized.

According to the invention, a voltage controlled variable capacitor is provided which can change the capacitance value thereof in a wide controlled voltage range and control the capacitance value easily with a high precision without complicating the circuit configuration thereof. Further, the voltage controlled variable capacitor is provided which can change the capacitance value thereof with a good linearity.

BREIF DESCRIPTION OF THE DRAWINGS

DESCRIPTION OF THE PREFERRED EMBODIMENTS (First Embodiment)

In first and second embodiments, the explanation will be made as to a case where the gate lengths of MOS transistors are respectively differentiated among a plurality of variable capacitance means thereby to differentiate threshold voltages among the MOS transistors respectively.

Figure 1:
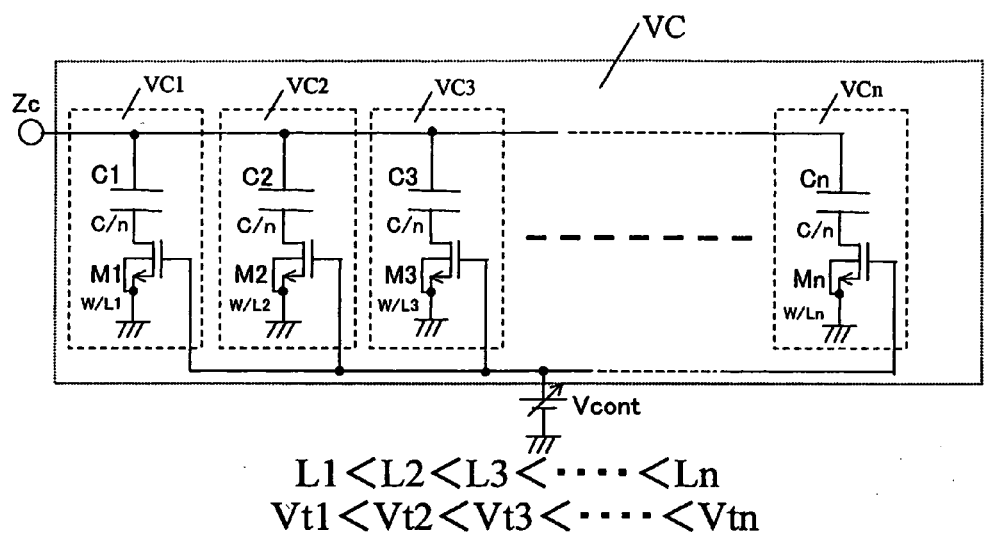
FIG. 1 is a diagram showing the configuration of a voltage controlled varactor for explaining the first embodiment of the invention.
Figure 2:
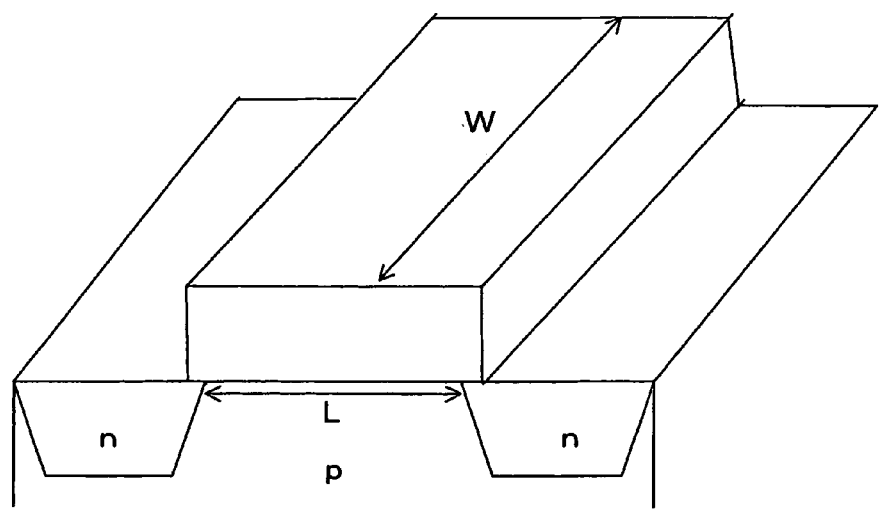
FIG. 2 is a diagram showing the schematic configuration of a MOS transistor.

FIG. 1 is a diagram showing the configuration of a voltage controlled varactor for explaining the first embodiment of the invention. The voltage controlled varactor VC according to the embodiment is configured in a manner that varactors $VC_k$ (k=1, 2, - - - , n, where n is an integer equal to or more than 2), each formed by a series connection of a fixed capacitor $C_k$ (k=1, 2, - - - , n, where n is an integer equal to or more than 2) of a capacitance value of C/n and a MOS transistor $M_k$ (k=1, 2, - - - , n, where n is an integer equal to or more than 2) of N channel type, are connected in parallel. In the voltage controlled varactor according to the embodiment, a capacitance value (a composite capacitance value of the plurality of the varactors VC1 to VCn) seen from the other end thereof (a terminal Zc) is changed in accordance with a control voltage Vcont applied to one end thereof. The size of the MOS transistor for determining the capacitance value of the varactor $VC_k$ seen from the terminal Zc is determined by a gate width W and a gate length L as shown in FIG. 2. However, the MOS transistors M1 to Mn constituting the voltage controlled varactor VC shown in FIG. 1 have the same gate width W but have different gate lengths (L1<L2< - - - <Ln), respectively. Thus, threshold voltages $V_{tk}$ of the MOS transistors M1 to Mn, at which the MOS transistors start to turn on in response to the gate voltage applied thereto, differ among the varactors VC1 to VCn, respectively (that is, Vt1<Vt2< - - - <Vtn). The varactors VC1 to VCn exhibit the capacitance values based on the different threshold voltages with respect to the predetermined control voltage, respectively.

The varactor $VC_k$ is arranged in a manner that the one end of the fixed capacitor $C_k$ is connected to the terminal Zc and the other end is connected to the drain of the MOS transistor $M_k$. The source of the MOS transistor $M_k$ is grounded, the gate thereof is applied with the control voltage Vcont and the back gate thereof is grounded. The MOS transistors M1 to Mn contained in the varactors VC1 to VCn are configured in a manner that the gate lengths L1 to Ln are elongated sequentially (that is, L1<L2< - - - <Ln), so that the threshold voltages Vt1 to Vtn are increased sequentially (that is, Vt1<Vt2< - - - <Vtn), respectively.

Figure 3:
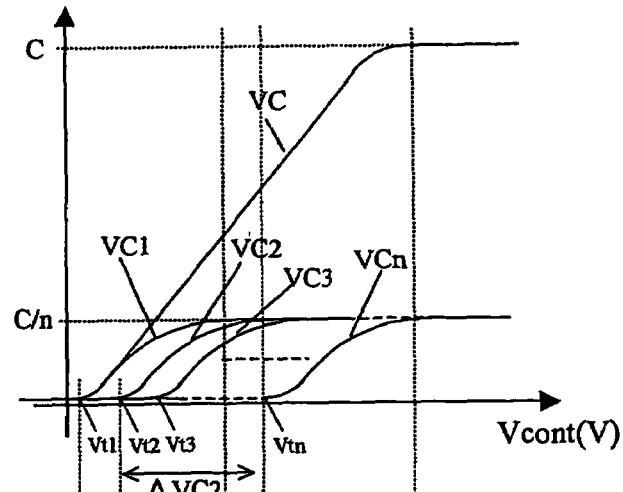
FIG. 3 is a diagram for explaining the operational characteristics of the voltage controlled varactor according to the first embodiment.
Figure 3:
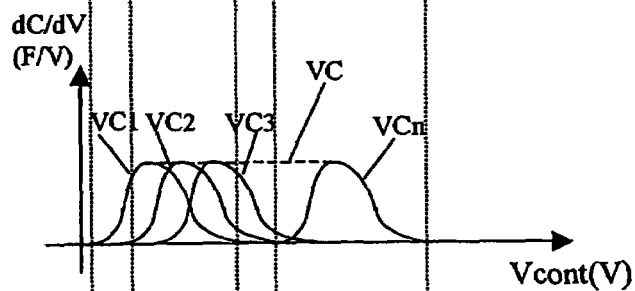
Figure 3:
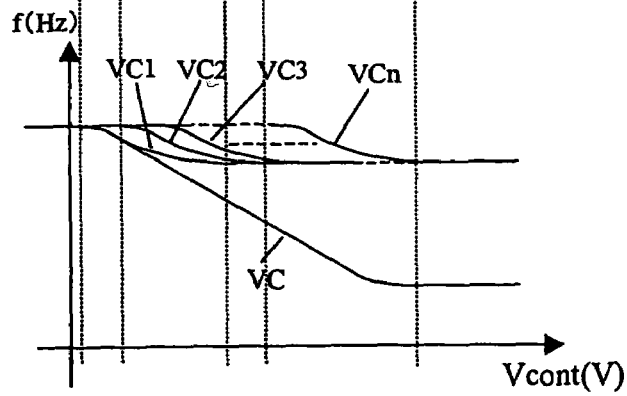

FIG. 3 is diagrams for explaining the operational characteristics of the voltage controlled varactor according to the first embodiment.

FIG. 3(A) is a diagram showing characteristics (C-V characteristics) of the change of a capacitance value seen from the terminal Zc with respect to the control voltage Vcont in the voltage controlled varactor. When the same control voltage Vcont is applied to the gates of the respective MOS transistors and then the control voltage is gradually increased from the ground level (GND), the MOS transistors M1 to Mn of the varactors VC1 to VCn are sequentially turned on when the control voltage Vcont reaches the threshold voltages Vt1 to Vtn, respectively. In other word, as the control voltage Vcont increases, the control voltage sequentially shifts its value by the threshold value Vt thereby to reduce the on-resistance values of the MOS transistors M1 to Mn, so that the capacitance value of each of the varactors VC1 to VCn changes from 0 (F) to C (F) within the controlled voltage range $\Delta VC$ of the varactor VCk. In FIG. 3(A), the controlled voltage ranges $\Delta VC1$, $\Delta VC2$ of the varactors VC1, VC2 are shown as an example. As shown in this figure, the controlled voltage ranges of the varactors (VC1 to VCn) are differentiated.

Since the voltage controlled varactor is arranged in a manner that the varactors VC1 to VCn are connected in parallel, the characteristics of the change of the entire capacitance value of the voltage controlled varactor is the sum (or composition) of the characteristics of the changes of the capacitance values of the varactors VC1 to VCn. Thus, when the gate lengths L1 to Ln of the MOS transistors are changed so that the threshold voltages Vt1 to Vtn of the MOS transistors M1 to Mn exhibit suitable values, respectively, the entire capacitance value VC of the voltage controlled varactor seen from the terminal Zc changes smoothly with good linearity from 0 (F) to C (F) within the wide controlled voltage range ($\Delta VC$) as the control voltage Vcont.

FIG. 3(B) is a diagram showing the changing rate (C-V sensitivity) of the capacitance value VC of the voltage controlled varactor with respect to the control voltage Vcont. As shown in this figure, when the gate lengths L1 to Ln of the MOS transistors M1 to Mn are set to determine the threshold voltages Vt1 to Vtn so that the C-V sensitivity of each of the varactors VC1 to VCn becomes almost constant within the controlled voltage range $\Delta VC$, the changing characteristics of the capacitance value VC of the voltage controlled varactor can be made to have good linearity.

Figure 4:
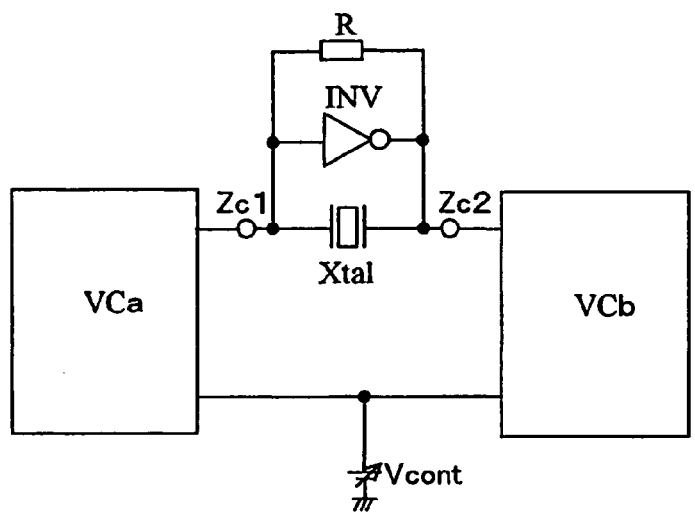
FIG. 4 is a diagram showing the configuration of a voltage controlled crystal oscillator using the voltage controlled varactor according to the embodiment.

Next, the explanation will be made as to the case where the voltage controlled varactor according to the embodiment is used in a voltage controlled crystal oscillator (VCXO). FIG. 4 is a diagram showing the configuration of the voltage controlled crystal oscillator using the voltage controlled varactor according to the embodiment. As shown in the figure, the voltage controlled crystal oscillator is arranged in a manner that one and the other ends of a parallel connection formed by a resistor R, an inverter INV and a crystal Xtal are connected to terminals Zc1, Zc2, and one ends (connection terminals) of voltage controlled varactors Vca, VCb are connected to the terminals Zc1, Zc2, respectively, and a control voltage Vcont is applied to the other ends (control input terminals) of the voltage controlled varactors Vca, VCb. The voltage controlled crystal oscillator changes its oscillation frequency in accordance with the capacitance values of the voltage controlled varactors Vca, VCb.

FIG. 3(C) is a diagram showing the characteristics (f-V characteristics) of the oscillation frequency with respect to the control voltage Vcont in the case of constituting the voltage controlled crystal oscillator shown in FIG. 4 by using the voltage controlled varactor according to the embodiment. As shown in this figure, when the control voltage Vcont is changed in the voltage range $\Delta VC$ by using the voltage controlled varactor according to the embodiment, the capacitance value VC of the voltage controlled varactor can be changed substantially in a linear manner. Thus, the oscillation frequency of the voltage controlled crystal oscillator can also be changed substantially in a linear manner in the same voltage range ($\Delta VC$). Accordingly, when the voltage controlled varactor according to the embodiment is used in the voltage controlled crystal oscillator, the oscillation frequency of the crystal oscillator can be controlled in the wide controlled voltage range and further the oscillation frequency can be controlled easily with a high precision. Therefore, the voltage controlled crystal oscillator using the voltage controlled varactor according to the embodiment is easy to use as one for frequency compensation.

As explained above, in the voltage controlled varactor according to the embodiment, the controlled voltage ranges for the respective varactors (VC1 to VCn) differ from one another and the control voltage can be changed in the controlled voltage range which is composed by these controlled voltage ranges. Thus, the capacitance value (the composite capacitance value of the respective varactors VC1 to VCn) can be changed in the wide controlled voltage range. Therefore, the sensitivity of the change of the capacitance value with respect to the change of the control voltage can be made low. That is, since the capacitance value can be changed gently, the control voltage for obtaining a desired capacitance value can be easily generated. Further, since the same control voltage Vcont is applied to the plurality of varactors VC1 to VCn, the capacitance value can be easily controlled with a high precision without complicating the circuit configuration. Further, according to the voltage controlled varactor according to the embodiment, the respective gate lengths (L1 to Ln) are set so as to differentiate the respective threshold voltages from one another so that the capacitance value of the varactor VC2 starts to change when the changing amount (changing rate) of the capacitance value of the varactor VC1 reduces after it starts to change. Thus, the changing amount (changing rate) of the capacitance value (the composite capacitance value of the respective varactors VC1 to VCn) with respect to the change of the control voltage can be made constant and so the capacitance value can be controlled with good linearity with respect to the change of the control voltage.

(Second Embodiment)

Figure 5:
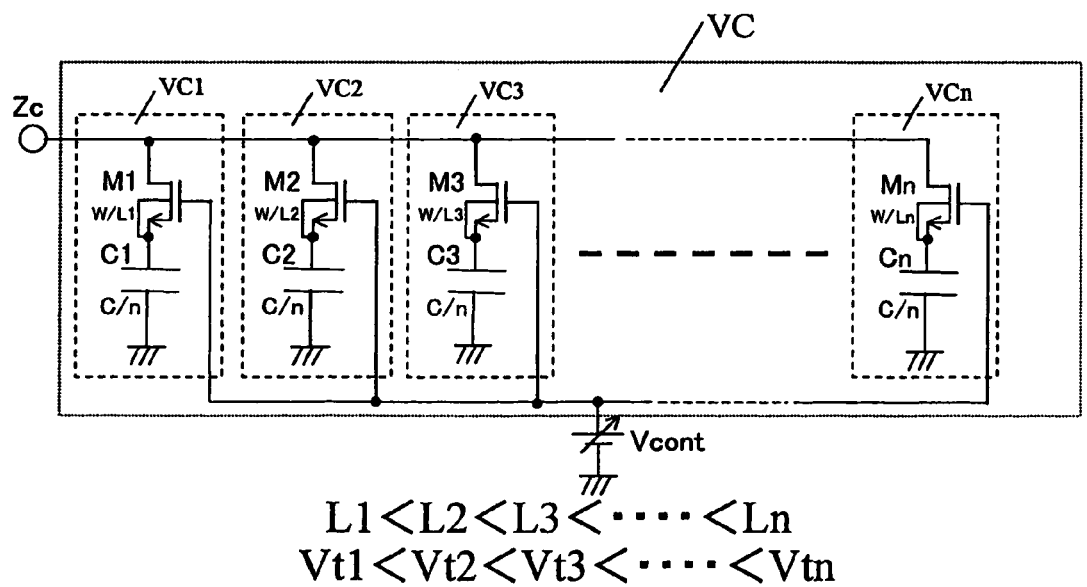
FIG. 5 is a diagram showing the configuration of the voltage controlled varactor for explaining the second embodiment of the invention.

FIG. 5 is a diagram showing the configuration of the voltage controlled varactor for explaining the second embodiment of the invention. In the figure, portions identical to those of FIG. 1 explained in the first embodiment are referred to by the common symbols.

In the voltage controlled varactor according to this embodiment, the positional relation between a fixed capacitor Ck (k=1, 2, - - - , n, where n is an integer equal to or more than 2) and a MOS transistor Mk (k=1, 2, - - - , n, where n is an integer equal to or more than 2) in each of varactors VCk (k=1, 2, - - - , n, where n is an integer equal to or more than 2) is reverse to that of the first embodiment. That is, according to this embodiment, the varactor VCk is arranged in a manner that the one end of the fixed capacitor Ck is grounded and the other end thereof is connected to the source of the MOS transistor Mk. The MOS transistor Mk is connected at its drain to a terminal Zc and is supplied at its gate with a control voltage Vcont.

The operation and effect of the voltage controlled varactor according to this embodiment is same as that of the voltage controlled varactor according to the first embodiment.

(Third Embodiment)

In third and fourth embodiments, the explanation will be made as to a case where the gate widths of MOS transistors are respectively differentiated among a plurality of variable capacitance means.

Figure 6:
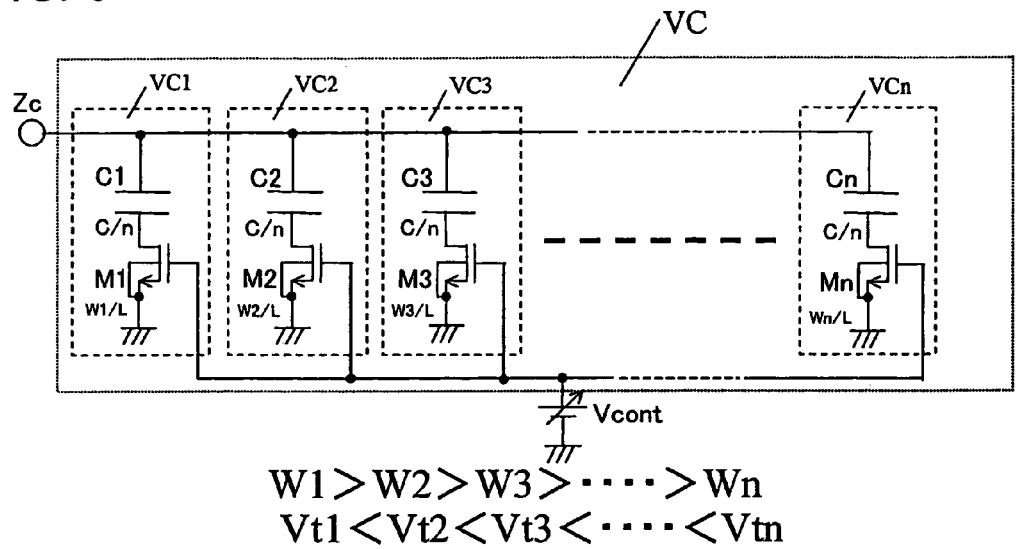
FIG. 6 is a diagram showing the configuration of the voltage controlled varactor for explaining the third embodiment of the invention.

FIG. 6 is a diagram showing the configuration of the voltage controlled varactor for explaining the third embodiment of the invention. In this figure, portions identical to those of FIG. 1 explained in the first embodiment are referred to by the common symbols. In the first embodiment, the gate lengths of MOS transistors M1 to Mn are respectively differentiated from one another thereby to differentiate the threshold voltages among the MOS transistors, respectively. In contrast, in this embodiment, the gate widths of the MOS transistors M1 to Mn are set to have different values (W1>W2>W3> - - - >Wn) thereby to differentiate threshold voltages Vtk (Vt1<Vt2< - - - <Vtn) among the MOS transistors, respectively.

The MOS transistors M1 to Mn constituting the voltage controlled varactor VC according to the embodiment is arranged in a manner that gate lengths L are the same but the gate widths W1 to Wn are differentiated respectively (that is, W1 >W2>W3> - - - >Wn). Thus, the MOS transistors M1 to Mn have threshold values Vtk, at which the MOS transistors start to turn on in response to the gate voltage applied thereto, different among the varactors VC1 to VCn, respectively (that is, Vt1<Vt2< - - - <Vtn).

As shown in FIG. 6, the voltage controlled varactor VC according to the embodiment is configured in a manner that the varactors VCk (k=1, 2, - - - , n, where n is an integer equal to or more than 2), each formed by a series connection of a fixed capacitor Ck (k=1, 2, - - - , n, where n is an integer equal to or more than 2) of a capacitance value of C/n and a MOS transistor Mk (k=1, 2, - - - , n, where n is an integer equal to or more than 2) of N channel type, are connected in parallel. In the voltage controlled varactor according to the embodiment, a capacitance value seen from the other end thereof (a terminal Zc) is changed in accordance with a control voltage Vcont applied to one end thereof. The MOS transistors M1 to Mn constituting the voltage controlled varactor VC according to the embodiment is arranged in a manner that gate lengths L are the same but the gate widths W1 to Wn are differentiated respectively (that is, W1>W2>W3> - - - >Wn). Thus, the MOS transistors M1 to Mn have the threshold values, at which the MOS transistors start to turn on in response to the gate voltage applied thereto, different among the varactors VC1 to VCn, respectively (that is, Vt1<Vt2< - - - <Vtn).

The varactor VCk is arranged in a manner that the one end of the fixed capacitor Ck is connected to the terminal Zc and the other end is connected to the drain of the MOS transistor Mk. The source of the MOS transistor Mk is grounded, the gate thereof is applied with the control voltage Vcont and the back gate thereof is grounded. The MOS transistors M1 to Mn contained in the varactors VC1 to VCn are configured in a manner that the gate widths W1 to Wn are shortened sequentially (that is, W1>W2> - - - >Wn), so that the threshold voltages Vt1 to Vtn are increased sequentially (that is, Vt1<Vt2< - - - <Vtn), respectively.

The operation and effect of the voltage controlled varactor according to this embodiment is same as that of the voltage controlled varactor according to the first and second embodiments. That is, in the voltage controlled varactor according to the embodiment, the controlled voltage ranges for the respective varactors (VC1 to VCn) differ from one another and the control voltage can be changed in the controlled voltage range which is composed by these controlled voltage ranges. Thus, the capacitance value (the composite capacitance value of the respective varactors VC1 to VCn) can be changed in the wide controlled voltage range. Therefore, the sensitivity of the change of the capacitance value with respect to the change of the control voltage can be made low. That is, since the capacitance value can be changed gently, the control voltage for obtaining a desired capacitance value can be easily generated. Further, since the same control voltage Vcont is applied to the plurality of varactors VC1 to VCn, the capacitance value can be easily controlled with a high precision without complicating the circuit configuration. Further, according to the voltage controlled varactor according to the embodiment, the respective gate widths (W1 to Wn) are set so as to differentiate the respective threshold voltages from one another so that the capacitance value of the varactor VC2 starts to change when the changing amount of the capacitance value of the varactor VC1 reduces after it starts to change. Thus, the changing rate of the capacitance value (the composite capacitance value of the respective varactors VC1 to VCn) with respect to the change of the control voltage can be made constant and so the capacitance value can be controlled with good linearity with respect to the change of the control voltage.

(Fourth Embodiment)

Figure 7:
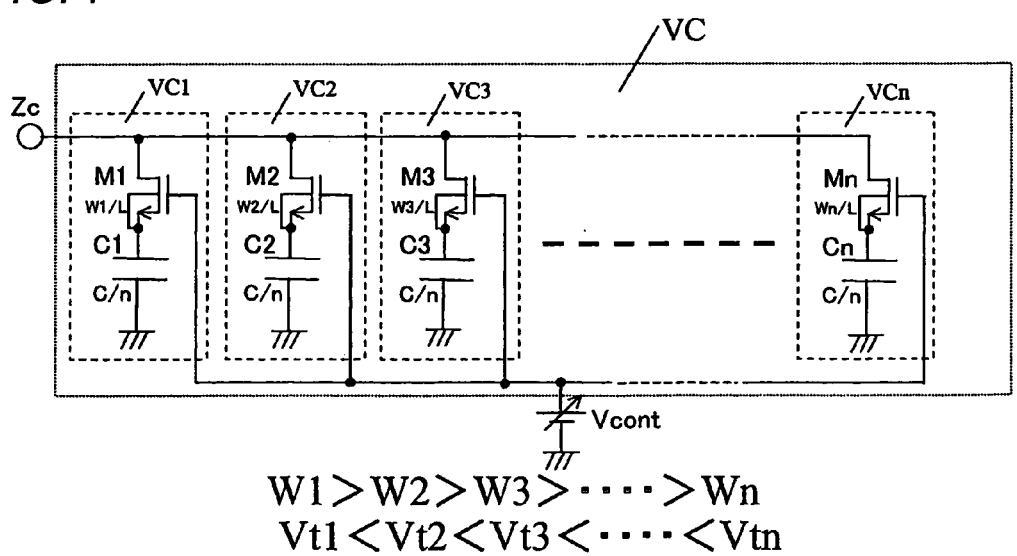
FIG. 7 is a diagram showing the configuration of the voltage controlled varactor for explaining the fourth embodiment of the invention.

FIG. 7 is a diagram showing the configuration of the voltage controlled varactor for explaining the fourth embodiment of the invention. In the figure, portions identical to those of FIG. 6 explained in the third embodiment are referred to by the common symbols.

In the voltage controlled varactor according to this embodiment, the positional relation between a fixed capacitor Ck (k=1, 2, - - - , n, where n is an integer equal to or more than 2) and a MOS transistor Mk (k=1, 2, - - - , n, where n is an integer equal to or more than 2) in each of varactors VCk (k=1, 2, - - - , n, where n is an integer equal to or more than 2) is reverse to that of the third embodiment. That is, according to this embodiment, the varactor VCk is arranged in a manner that the one end of the fixed capacitor Ck is grounded and the other end thereof is connected to the source of the MOS transistor Mk. The MOS transistor Mk is connected at its drain to a terminal Zc and is supplied at its gate with a control voltage Vcont.

The operation and effect of the voltage controlled varactor according to this embodiment is same as that of the voltage controlled varactor according to the third embodiment.

(Fifth Embodiment)

In fifth and sixth embodiments, the explanation will be made as to a case where a ratio between the gate width and the gate length of a MOS transistor is differentiated among a plurality of variable capacitance means.

Figure 8:
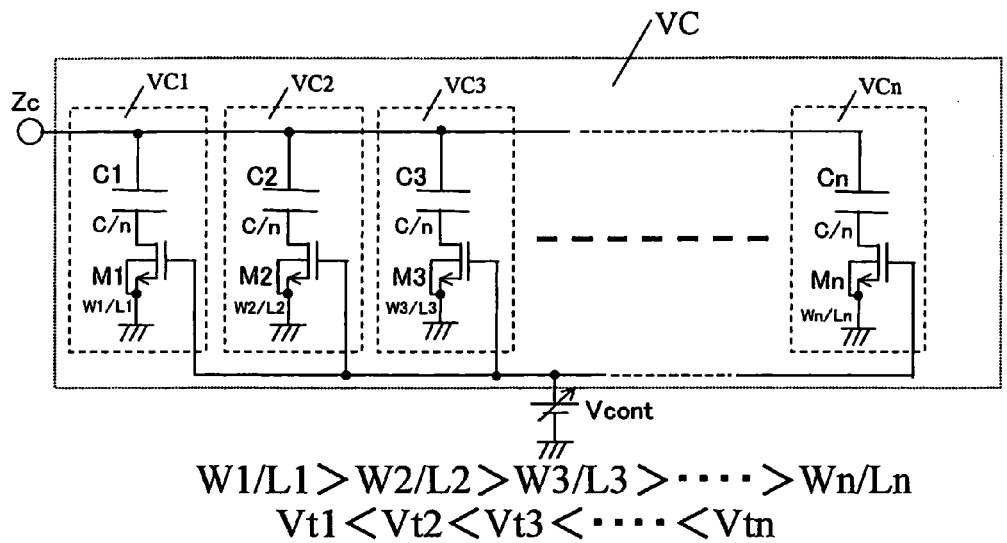
FIG. 8 is a diagram showing the configuration of the voltage controlled varactor for explaining the fifth embodiment of the invention.

FIG. 8 is a diagram showing the configuration of the voltage controlled varactor for explaining the fifth embodiment of the invention. In this figure, portions identical to those of FIG. 1 explained in the first embodiment are referred to by the common symbols. In the first embodiment, the gate lengths of MOS transistors M1 to Mn are respectively differentiated from one another thereby to differentiate the threshold voltages among the MOS transistors respectively. In contrast, in this embodiment, the ratio of the gate width with respect to the gate length of the MOS transistor is set to have different values among the respective MOS transistors M1 to Mn (W1/L1>W2/L2>W3/L3> - - - >Wn/Ln) thereby to differentiate threshold voltages Vtk (Vt1<Vt2< - - - <Vtn) among the MOS transistors, respectively.

The MOS transistors M1 to Mn constituting the voltage controlled varactor VC according to the embodiment is arranged in a manner that the ratios (W1/L1 to Wn/Ln) of the gate widths with respect to the gate lengths of the MOS transistors are set to have different values from one another (that is, W1/L1>W2/L2>W3/L3 > - - - >Wn/Ln). Thus, the MOS transistors M1 to Mn have threshold values Vtk, at which the MOS transistors start to turn on in response to the gate voltage applied thereto, different among the varactors VC1 to VCn, respectively (that is, Vt1<Vt2 < - - - <Vtn).

As shown in FIG. 8, the voltage controlled varactor VC according to the embodiment is configured in a manner that the varactors VCk, each formed by a series connection of a fixed capacitor Ck (k=1, 2, - - - , n, where n is an integer equal to or more than 2) of a capacitance value of C/n and a MOS transistor Mk (k=1, 2, - - - , n, where n is an integer equal to or more than 2) of N channel type, are connected in parallel. In the voltage controlled varactor according to the embodiment, a capacitance value seen from the other end thereof (a terminal Zc) is changed in accordance with a control voltage Vcont applied to one end thereof. The MOS transistors M1 to Mn constituting the voltage controlled varactor is arranged in a manner that the ratios (W1/L1 to Wn/Ln) of the gate widths with respect to the gate lengths of the MOS transistors are set to have the different values from one another (that is, W1/L1>W2/L2>W3/L3> - - - > Wn/Ln). Thus, the MOS transistors M1 to Mn have the threshold values Vtk, at which the MOS transistors start to turn on in response to the gate voltage applied thereto, different among the varactors VC1 to VCn, respectively (that is, Vt1<Vt2< - - - <Vtn).

The varactor VCk is arranged in a manner that the one end of the fixed capacitor Ck is connected to the terminal Zc and the other end is connected to the drain of the MOS transistor Mk. The source of the MOS transistor Mk is grounded, the gate thereof is applied with the control voltage Vcont and the back gate thereof is grounded. The MOS transistors M1 to Mn contained in the varactors VC1 to VCn are configured in a manner that the ratios W1/L1 to Wn/Ln of the gate widths with respect to the gate lengths of the MOS transistors are shortened sequentially (that is, W1/L1>W2/L2>W3/L3> - - - >Wn/Ln), so that the threshold voltages Vt1 to Vtn are increased sequentially (that is, Vt1<Vt2< - - - <Vtn), respectively.

The operation and effect of the voltage controlled varactor according to this embodiment is same as that of the voltage controlled varactor according to the first to fourth embodiments. That is, in the voltage controlled varactor according to the embodiment, the controlled voltage ranges for the respective varactors (VC1 to VCn) differ from one another and the control voltage can be changed in the controlled voltage range which is composed by these controlled voltage ranges. Thus, the capacitance value (the composite capacitance value of the respective varactors VC1 to VCn) can be changed in the wide controlled voltage range. Therefore, the sensitivity of the change of the capacitance value with respect to the change of the control voltage can be made low. That is, since the capacitance value can be changed gently, the control voltage for obtaining a desired capacitance value can be easily generated. Further, since the same control voltage Vcont is applied to the plurality of varactors VC1 to VCn, the capacitance value can be easily controlled with a high precision without complicating the circuit configuration. Further, according to the voltage controlled varactor according to the embodiment, the respective ratios (W1/L1 to Wn/Ln) of the gate widths with respect to the gate lengths are set so as to differentiate the respective threshold voltages from one another so that the capacitance value of the varactor VC2 starts to change when the changing amount of the capacitance value of the varactor VC1 reduces after it starts to change. Thus, the changing rate of the capacitance value (the composite capacitance value of the respective varactors VC1 to VCn) with respect to the change of the control voltage can be made constant and so the capacitance value can be controlled with good linearity with respect to the change of the control voltage.

(Sixth Embodiment)

Figure 9:
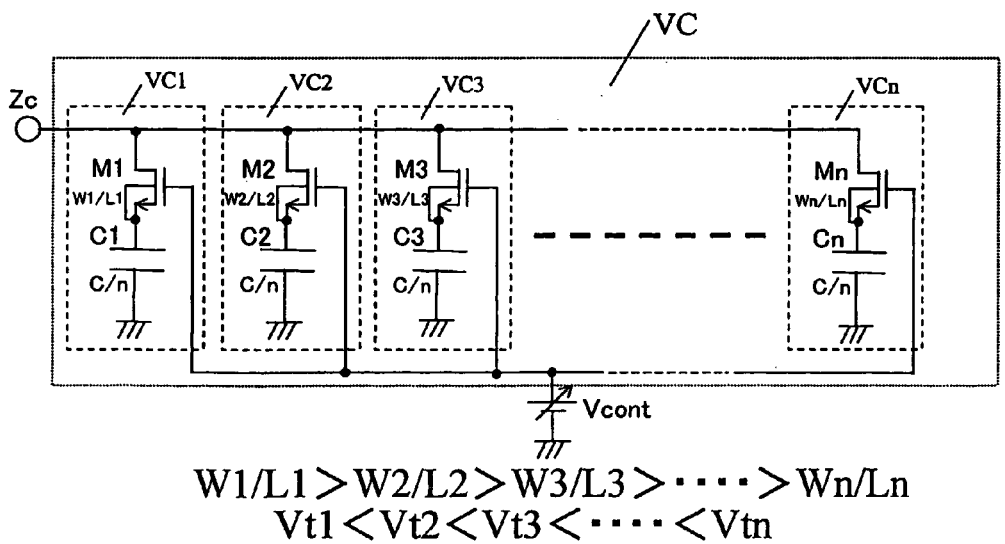
FIG. 9 is a diagram showing the configuration of the voltage controlled varactor for explaining the sixth embodiment of the invention.

FIG. 9 is a diagram showing the configuration of the voltage controlled varactor for explaining the sixth embodiment of the invention. In the figure, portions identical to those of FIG. 8 explained in the fifth embodiment are referred to by the common symbols.

In the voltage controlled varactor according to this embodiment, the positional relation between a fixed capacitor Ck (k=1, 2, - - - , n, where n is an integer equal to or more than 2) and a MOS transistor Mk (k=1, 2, - - - , n, where n is an integer equal to or more than 2) in each of varactors VCk (k=1, 2, - - - , n, where n is an integer equal to or more than 2) is reverse to that of the fifth embodiment. That is, according to this embodiment, the varactor VCk is arranged in a manner that the one end of the fixed capacitor Ck is grounded and the other end thereof is connected to the source of the MOS transistor Mk. The MOS transistor Mk is connected at its drain to a terminal Zc and is supplied at its gate with a control voltage Vcont.

The operation and effect of the voltage controlled varactor according to this embodiment is same as that of the voltage controlled varactor according to the fifth embodiment.

(Seventh Embodiment)

In seventh and eighth embodiments, the explanation will be made as to a case where the back gate voltages of MOS transistors are differentiated among a plurality of variable capacitance means.

Figure 10:
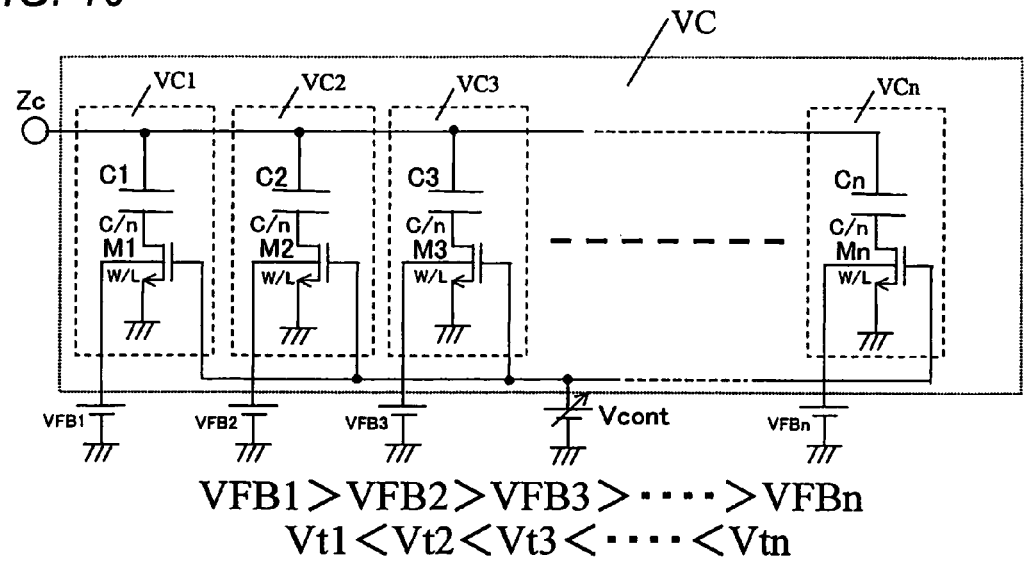
FIG. 10 is a diagram showing the configuration of the voltage controlled varactor for explaining the seventh embodiment of the invention.

FIG. 10 is a diagram showing the configuration of the voltage controlled varactor for explaining the seventh embodiment of the invention. In this figure, portions identical to those of FIG. 1 explained in the first embodiment are referred to by the common symbols. In the first embodiment, the gate lengths of MOS transistors M1 to Mn are respectively differentiated from one another thereby to differentiate the threshold voltages among the MOS transistors respectively. In contrast, in this embodiment, the back gate voltages VFBk of the MOS transistors M1 to Mn are set to have different values from one another (that is, VFB1>VFB2 > - - - >VFBn) thereby to differentiate threshold voltages Vtk (Vt1<Vt2< - - - <Vtn) among the MOS transistors, respectively.

As shown in the figure, the voltage controlled varactor VC according to the embodiment is configured in a manner that the varactors VCk (k=1, 2, - - - , n, where n is an integer equal to or more than 2), each formed by a series connection of a fixed capacitor Ck (k=1, 2, - - - , n, where n is an integer equal to or more than 2) of a capacitance value of C/n and a MOS transistor Mk (k=1, 2, - - - , n, where n is an integer equal to or more than 2) of N channel type, are connected in parallel. In the voltage controlled varactor according to the embodiment, a capacitance value seen from the other end thereof (a terminal Zc) is changed in accordance with a control voltage Vcont applied to one end thereof. The MOS transistors M1 to Mn constituting the voltage controlled varactor is arranged in a manner that each of the gate widths W and the gate lengths L are same but the back gate voltages (VFBk) thereof for respectively determining the capacitance values of the varactors VCk seen from the terminal Zc are differentiated from one another (that is, VFB1>VFB2> - - - >VFBn). Thus, the MOS transistors M1 to Mn have the threshold values, at which the MOS transistors start to turn on in response to the gate voltage applied thereto, different among the varactors VC1 to VCn, respectively.

The varactor VCk is arranged in a manner that the one end of the fixed capacitor Ck is connected to the terminal Zc and the other end is connected to the drain of the MOS transistor Mk. The source of the MOS transistor Mk is grounded, the gate thereof is applied with the control voltage Vcont and the back gate thereof is supplied with a predetermined voltage VFBK. The MOS transistors M1 to Mn contained in the varactors VC1 to VCn are configured in a manner that the back gate voltages VFB1 to VFBn are lowered sequentially (that is, VFB1>VFB2> - - - >VFBn), so that the threshold voltages Vt1 to Vtn are increased sequentially (that is, Vt1<Vt2< - - - <Vtn), respectively.

The operation and effect of the voltage controlled varactor according to this embodiment is same as that of the voltage controlled varactor according to the first to sixth embodiments. That is, in the voltage controlled varactor according to the embodiment, the controlled voltage ranges for the respective varactors (VC1 to VCn) differ from one another and the control voltage can be changed in the controlled voltage range which is composed by these controlled voltage ranges. Thus, the capacitance value (the composite capacitance value of the respective varactors VC1 to VCn) can be changed in the wide controlled voltage range. Therefore, the sensitivity of the change of the capacitance value with respect to the change of the control voltage can be made low. That is, since the capacitance value can be changed gently, the control voltage for obtaining a desired capacitance value can be easily generated. Further, since the same control voltage Vcont is applied to the plurality of varactors VC1 to VCn, the capacitance value can be easily controlled with a high precision without complicating the circuit configuration. Further, according to the voltage controlled varactor according to the embodiment, the respective back gate voltages (VFB1 to VFBn) are set so as to differentiate the respective threshold voltages from one another so that the capacitance value of the varactor VC2 starts to change when the changing amount of the capacitance value of the varactor VC1 reduces after it starts to change. Thus, the changing rate of the capacitance value (the composite capacitance value of the respective varactors VC1 to VCn) with respect to the change of the control voltage can be made constant and so the capacitance value can be controlled with good linearity with respect to the change of the control voltage.

(Eighth Embodiment)

Figure 11:
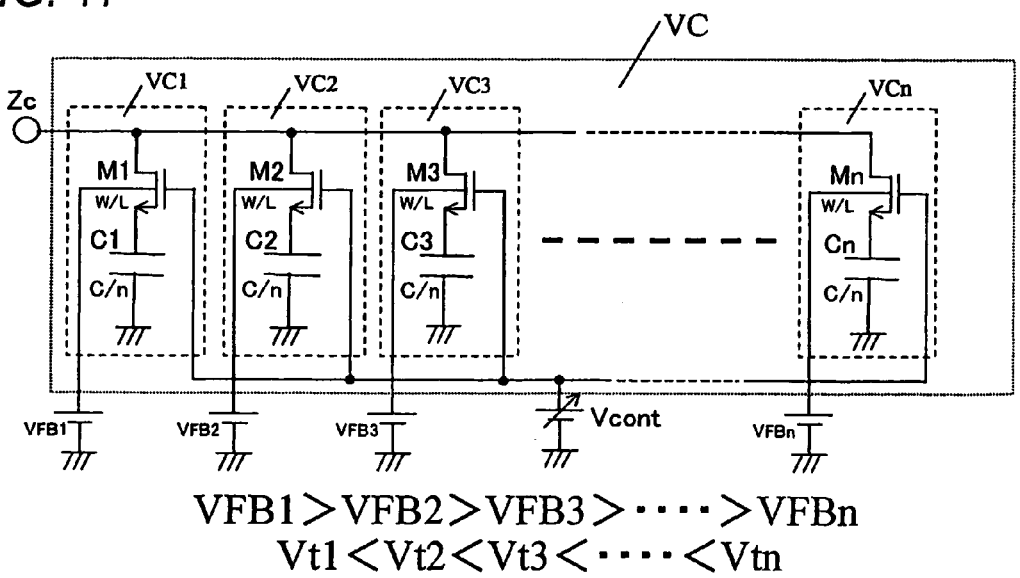
FIG. 11 is a diagram showing the configuration of the voltage controlled varactor for explaining the eighth embodiment of the invention.
Figure 12:
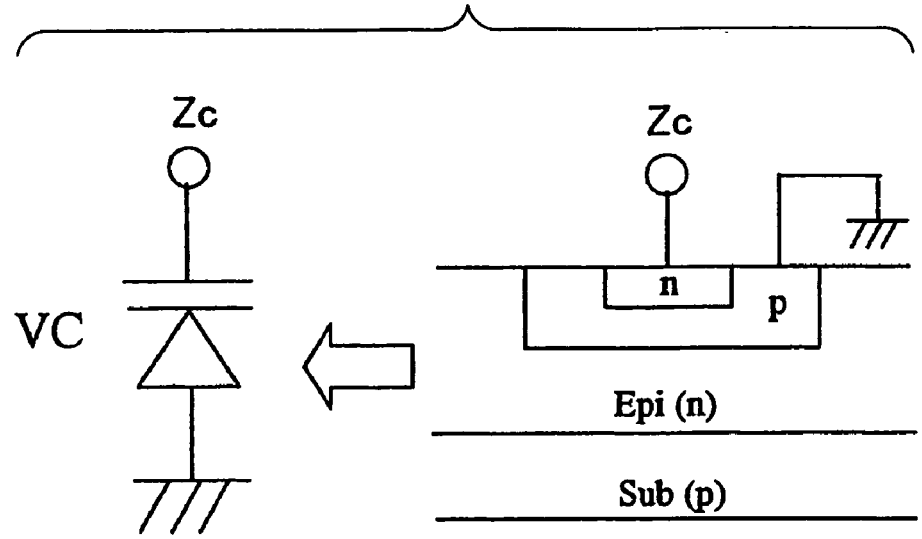
FIG. 12 is a diagram for explaining the configuration of a conventional voltage controlled variable capacitor (voltage controlled varactor) using a diode.
Figure 13:
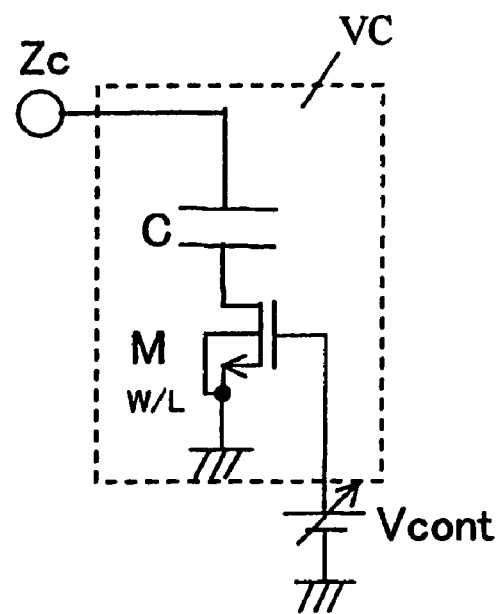
FIG. 13 is a diagram for explaining the configuration of a conventional voltage controlled variable capacitor (voltage controlled varactor) using a fixed capacitor and a MOS transistor.
Figure 14:
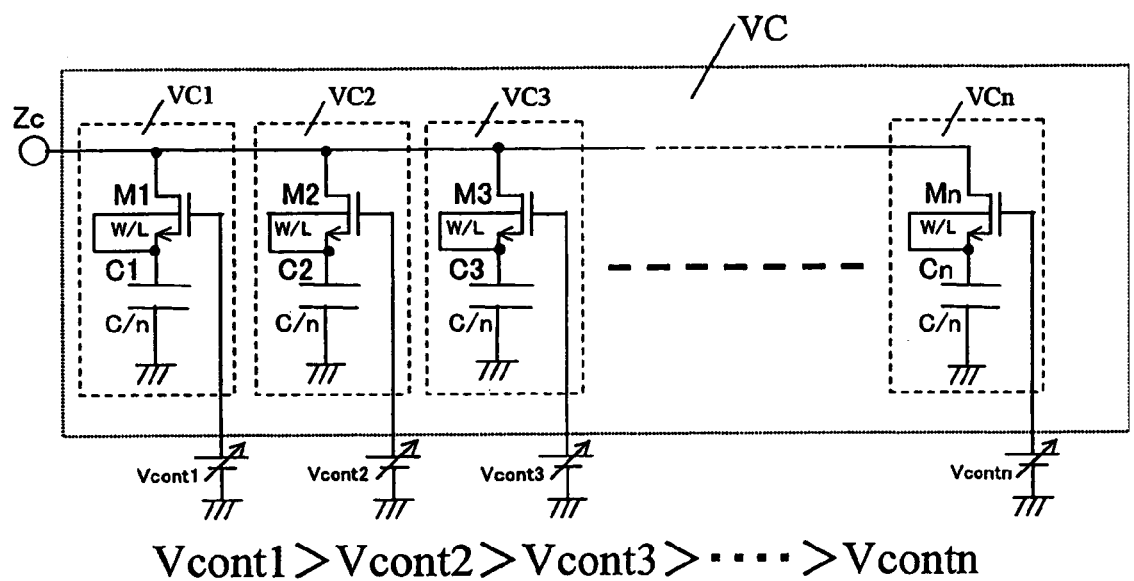
FIG. 14 is a diagram for explaining the configuration of a conventional voltage controlled variable capacitor (voltage controlled varactor) in which a plurality of the voltage controlled varactors shown in FIG. 13 are connected in parallel.
Figure 15:
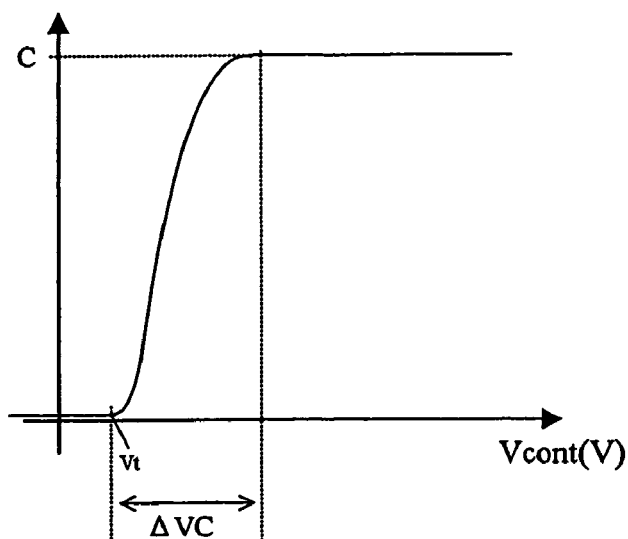
FIG. 15 is a diagram for explaining the operational characteristics of a conventional voltage controlled varactor shown in FIG. 13.
Figure 15:
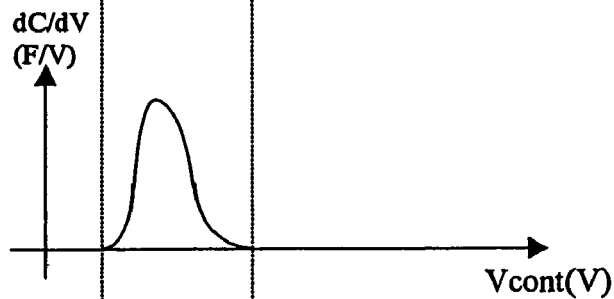
Figure 15:
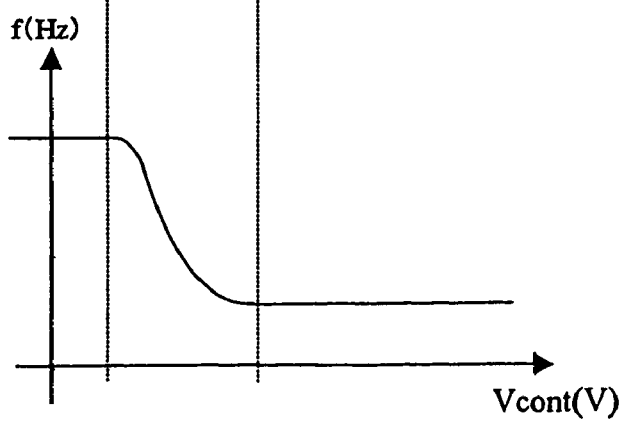

FIG. 11 is a diagram showing the configuration of the voltage controlled varactor for explaining the eighth embodiment of the invention. In the figure, portions identical to those of FIG. 10 explained in the seventh embodiment are referred to by the common symbols.

In the voltage controlled varactor according to this embodiment, the positional relation between a fixed capacitor Ck (k=1, 2, - - -, n, where n is an integer equal to or more than 2) and a MOS transistor Mk (k=1, 2, - - -, n, where n is an integer equal to or more than 2) in each of varactors VCk (k=1, 2, - - -, n, where n is an integer equal to or more than 2) is reverse to that of the seventh embodiment. That is, according to this embodiment, the varactor VCk is arranged in a manner that the one end of the fixed capacitor Ck is grounded and the other end thereof is connected to the source of the MOS transistor Mk. The MOS transistor Mk is connected at its drain to a terminal Zc and is supplied at its gate with a control voltage Vcont and also supplied at its back gate with a predetermined voltage (VFBk).

The operation and effect of the voltage controlled varactor according to this embodiment is same as that of the voltage controlled varactor according to the first to seventh embodiments.

In the voltage controlled varactor according to each of the first to eighth embodiments explained above, the sensitivity of the change of the capacitance value with respect to the change of the control voltage can be made high when the capacitance value of each of the fixed capacitors is increased.

Since the voltage controlled varactor explained above is constituted only by the elements such as the fixed capacitors, MOS transistors which can be fabricated by the usual semiconductor manufacturing processes, the voltage controlled varactor can be realized at a low cost.

Although the MOS transistors of N channel are used in the aforesaid explanation, MOS transistors of P channel may be used therefor. In the case of using the MOS transistors of P channel, the drain side thereof is grounded and the source side thereof is connected to the fixed capacitor. Further, in this case, the change of the capacitance value seen from the terminal Zc with respect to the change of the control voltage is opposite in the polarity to that of the MOS transistor of N channel.

The voltage controlled variable capacitor according to the invention has an effect that the capacitance value thereof can be changed in a wide controlled voltage range and the capacitance value can be easily controlled with a high precision without complicating the circuit configuration thereof. Thus, the invention is useful in a communication terminal etc. including a semiconductor integrated circuit, a VCXO module, a TCXO module and an oscillation module using a voltage controlled variable capacitor.

What is claimed is:

1. A voltage controlled variable capacitor of which capacitance value changes in accordance with a control voltage applied thereto, comprising:
    a plurality of variable capacitance means, each of which includes a fixed capacitor and a MOS transistor; and
    a common signal line connected to a gate of the MOS transistor for each of the plurality of variable capacitance means,
    wherein sizes of the MOS transistors, based on which the MOS transistors start to turn on in response to a gate voltage applied thereto, differ among the plurality of variable capacitance means;
    the plurality of variable capacitance means exhibit capacitance values based on the different sizes with respect to a predetermined control voltage, respectively; and
    a capacitance value of the voltage controlled variable capacitor is a composite value of the capacitance values of the plurality of variable capacitance means.

2. The voltage controlled variable capacitor according to claim 1, wherein:
    the variable capacitance means is constituted by connecting the fixed capacitor and source-drain of the MOS transistor; and
    the plurality of variable capacitance means are connected in parallel.

3. The voltage controlled variable capacitor according to claim 1, wherein the MOS transistors of the plurality of variable capacitance means start to turn on at different values of the control voltage applied thereto in accordance with increase of the control voltage, respectively.

4. The voltage controlled variable capacitor according to claim 1, wherein:

the MOS transistors of the plurality of variable capacitance means start to turn on sequentially one by one in accordance with increase of the control voltage, and the MOS transistor of next one of the plurality of variable capacitance means starts to turn on when a changing rate of a capacitance value of another of the plurality of variable capacitance means including the MOS transistor having been turned on previously starts to reduce.

5. The voltage controlled variable capacitor according to claim 1, wherein the MOS transistors have the same gate width and have different gate lengths from one another among the plurality of variable capacitance means.

6. The voltage controlled variable capacitor according to claim 1, wherein the MOS transistors have the same gate length and have different gate widths from one another among the plurality of variable capacitance means.

7. The voltage controlled variable capacitor according to claim 1, wherein a ratio between a gate width and a gate length of the MOS transistor is differentiated from one another among the plurality of variable capacitance means.

8. The voltage controlled variable capacitor according to claim 1, wherein back gate voltages of the MOS transistors are differentiated among the plurality of variable capacitance means, respectively.

9. A semiconductor integrated circuit including the voltage controlled variable capacitor according to claim 1.

10. The voltage controlled variable capacitor according to claim 1, further comprising:

a terminal connected to the fixed capacitor; and a ground terminal connected to a source of the MOS transistor of each of the plurality of variable capacitance means.

11. The voltage controlled variable capacitor according to claim 1, further comprising:

a ground terminal connected to the fixed capacitor, and a terminal connected to a source of the MOS transistor of each of the plurality of variable capacitance means.

12. An oscillator comprising:

an oscillation circuit;

a resonator; and a plurality of variable capacitance means connected to the oscillation circuit and the resonator, wherein:

each of said plurality of variable capacitance means includes a fixed capacitor and a MOS transistor, and a common signal line connected to a gate of the MOS transistor for each of the plurality of variable capacitance means, wherein:

sizes of the MOS transistors, based on which the MOS transistors start to turn on in response to a gate voltage applied thereto, differ among the plurality of variable capacitance means, the plurality of variable capacitance means exhibit capacitance values based on the different sizes with respect to a predetermined control voltage, respectively, and a capacitance value of the voltage controlled variable capacitor is a composite value of the capacitance values of the plurality of variable capacitance means.

13. The oscillator according to claim 12, wherein the oscillation circuit includes a resistor and an inverter connected in parallel across the resonator.

14. An oscillator comprising:

an oscillation circuit;

a resonator;

a first group of a plurality of variable capacitance means each connected to one end of the oscillation circuit and the resonator; and a second group of a plurality of variable capacitance means each connected to the other end of the oscillation circuit and the resonator, wherein:

each of said plurality of variable capacitance means of said first group and of said second group includes a fixed capacitor and a MOS transistor; and a common signal line connected to a gate of the MOS transistor for each of the plurality of variable capacitance means of said first group or said second group, wherein:

sizes of the MOS transistors, based on which the MOS transistors start to turn on in response to a gate voltage applied thereto, differ among the plurality of variable capacitance means, the plurality of variable capacitance means exhibit capacitance values based on the different sizes with respect to a predetermined control voltage, respectively, and a capacitance value of the voltage controlled variable capacitor is a composite value of the capacitance values of the plurality of variable capacitance means.

15. The oscillator according to claim 14, further comprising:

a first common signal line connecting to the gate of the MOS transistor for each of the plurality of variable capacitance means of the first group; and a second common signal line connecting to the gate of the MOS transistor for each of the plurality of variable capacitance means of the second group.

16. The oscillator according to claim 15, wherein said first common signal line and said second common signal line receive the same signal.

17. The oscillator according to claim 14, wherein said common signal line connects to the gate of the MOS transistor for each of the plurality of variable capacitance means of the first group and the second group.

18. A voltage controlled variable capacitor having a capacitance value which changes in accordance with a control voltage applied thereto, comprising:

a plurality of variable capacitors, each comprising:

a MOS transistor having a gate for receiving a common signal; and a fixed capacitor connected to the MOS transistor, wherein, MOS transistors of the plurality of variable capacitors turn on at different values of the control voltage applied thereto in accordance with a change of the control voltage, wherein the MOS transistors of the plurality of variable capacitors turn on sequentially in accordance with the change of the control voltage, wherein a MOS transistor of the plurality of variable capacitors turns on when a changing rate of a capacitance value of another of the plurality of variable capacitors including a MOS transistor having been turned on previously starts to reduce.

19. A voltage controlled variable capacitor having a capacitance value which changes in accordance with a control voltage applied thereto, comprising:

a plurality of variable capacitors, each comprising:

a MOS transistor having a gate for receiving a common signal; and a fixed capacitor connected to the MOS transistor, wherein, MOS transistors of the plurality of variable capacitors turn on at different values of the control voltage applied thereto in accordance with a change of the control voltage, wherein the MOS transistors have the same gate width and different gate lengths from one another among the plurality of variable capacitors.

* * * * *